(12) United States Patent
Ruby et al.

(10) Patent No.: US 6,329,296 B1
(45) Date of Patent: Dec. 11, 2001

(54) METAL CATALYST TECHNIQUE FOR TEXTURING SILICON SOLAR CELLS

(75) Inventors: Douglas S. Ruby; Saleem H. Zaidi, both of Albuquerque, NM (US)

(73) Assignee: Sandia Corporation

( * ) Notice: Subject to any disclaimer, the term of this patent is extended or adjusted under 35 U.S.C. 154(b) by 0 days.

(21) Appl. No.: 09/634,905

(22) Filed: Aug. 9, 2000

(51) Int. Cl.$^7$ ..................................................... H01L 21/00
(52) U.S. Cl. .............................. 438/712; 216/2; 216/11; 216/67; 216/79; 438/719; 438/735
(58) Field of Search ..................................... 438/710, 712, 438/719, 735, 24, 28; 216/2, 11, 42, 67, 79

(56) References Cited

PUBLICATIONS

J. I. Gittleman, E. K. Sichel, H. W. Lehmann and R. Widmer, Textured silicon: A selective absorber for solar thermal conversion, 1979 American Institute of Physics, Appl. Phys. Lett. 35(10), Nov. 15, 1979, accepted for publication Sep. 4, 1979, pp. 742–744.

Saleem H. Zaidi, James M. Gee, Douglas S. Ruby, and S. R. J. Brueck, Characterization of Si Nanostructured Surfaces, SPIE, Jul. 1999.

*Primary Examiner*—William A. Powell
(74) *Attorney, Agent, or Firm*—Russell D. Elliott

(57) ABSTRACT

Textured silicon solar cells and techniques for their manufacture utilizing metal sources to catalyze formation of randomly distributed surface features such as nanoscale pyramidal and columnar structures. These structures include dimensions smaller than the wavelength of incident light, thereby resulting in a highly effective anti-reflective surface. According to the invention, metal sources present in a reactive ion etching chamber permit impurities (e.g. metal particles) to be introduced into a reactive ion etch plasma resulting in deposition of micro-masks on the surface of a substrate to be etched. Separate embodiments are disclosed including one in which the metal source includes one or more metal-coated substrates strategically positioned relative to the surface to be textured, and another in which the walls of the reaction chamber are pre-conditioned with a thin coating of metal catalyst material.

18 Claims, 11 Drawing Sheets

METAL CATALYST TECHNIQUE FOR TEXTURING SILICON SOLAR CELLS

GOVERNMENT RIGHTS

The United States Government has rights in this invention pursuant to Contract No. DE-AC04-94AL85000 awarded by the U.S. Department of Energy. The Government has certain rights in this invention.

BACKGROUND OF THE INVENTION

1. Field of Invention

This invention pertains generally to the field of multicrystalline silicon solar cells and manufacturing techniques directed to yield improvements in optical performance of silicon solar cells. More specifically, the invention pertains to use of reactive ion etching (RIE) in the presence of metal catalysts to texture the surface of silicon solar cell material. The techniques described can controllably generate randomly distributed surface features optimally having dimensions comparable, or smaller than solar spectrum wavelengths.

2. Description of the Related Art

Multicrystalline silicon (mc-Si) is a frequently-used semiconductor substrate in the manufacture of silicon solar cells. Single crystal silicon (c-Si) is also used in manufacture of silicon solar cells, but it has certain disadvantages including the fact that it is more expensive than mc-Si. U.S. Pat. No. 6,091,021 describes some aspects of mc-Si solar cell fabrication developed by the present inventors, including use of micromasks (for example, a thin polycrystalline coating such as $SiO_2$) to aid in etched texturing of mc-Si surfaces. In that patent, techniques are disclosed which demonstrate that minute, randomly distributed micro-craters and pyramidal structures can be formed in the surface of the emitter of a solar cell (or any silicon surface, for that matter). This is accomplished, according to that patent, by performing a deposition of $SiO_2$, for example, with standard chemical vapor deposition methodologies in common use in the photovoltaics industry. As taught by the '021 patent, the "micro-mask" created by such deposition allows etchant (e.g., $SF_6/O_2$) to pass through micro-gaps to selectively etch exposed Si in the gap locations before reaching Si underneath the microcrystals. As a result, a random texturing of the Si surface is achieved. These randomly textured surfaces significantly reduce surface reflection over the usable spectral range, thus, increasing the light absorption in the solar cells. This, in turn, increases the likelihood that additional electron-hole pairs will be generated within the silicon matrix as a result of the photovoltaic effect.

Additional relevant background information can be found in U.S. Pat. No. 6,091,021, which is hereby incorporated by reference, in its entirety. Although the '021 patent represents one approach to silicon (especially, mc-Si) texturing, the need remains for more flexibility in the available texturing technologies compatible with solar cell manufacturing techniques. The present invention offers alternate processes aimed at engineering randomly textured surfaces compatible with existing etching methods and standard solar cell manufacturing processes. The present invention, according to at least one embodiment, also can be adapted to allow optimal random texturing of silicon solar cell material processed at a high throughput rate.

BRIEF SUMMARY OF THE INVENTION

The technology described in this disclosure is compatible with various manufacturing processes and applications for which surface-textured silicon is needed or advantageous. Various objects and advantages can be attained as a result of use of the present invention in which metal "impurities" (particles) are intentionally introduced into the environment inside a reactive ion etching (RIE) chamber while the random ion etching of the silicon surface takes place. As more fully explained in the detailed description, tailored texturization can be engineered according to one embodiment by a strategic placement of metal-coated silicon samples at various locations relative to the surface of the silicon wafer inside the RIE chamber. Some of the suitable metal species include, for example, Cr, Au, Cu, Al, Pd, and Ti.

According to another embodiment, desired texturing results and high throughput can be achieved by conditioning the RIE chamber with a suitable choice of metal catalysts. This can include, for example, forming a thin layer of metal, or metals on the inner surfaces of the chamber prior to RIE texturing of silicon in the chamber. (Suitable metal species include those just mentioned in conjunction with the embodiment utilizing metal-coated Si samples.)

Metal thus introduced into the RIE chamber has the effect of introducing "micro-masks" (or microscopic particles of metal) into the RIE environment. Metal present in the reaction chamber "catalyzes" the formation of random nanoscale features on the surface of silicon etched in the chamber, thus resulting in an optically-favorable texturing beneficial for solar cell applications. Silicon surfaces textured in this fashion include, for example, columnar and pyramidal features with dimensions that can be much smaller than the wavelength of incident light. This sub-wavelength fabrication technology enables creation of a layer of a tailored index of refraction, spanning the range defined by the refractive indices of air and silicon. Therefore, the invention enables fabrication of an optimum anti-reflective layer on, for example, a mc-Si solar cell, to optimize photon absorption over a broad spectral range and enhance solar cell efficiency. Moreover, the processes of the invention induce only slight surface damage to the Si, if any, which does not significantly diminish current extraction from the solar cell. Such damage, if it occurs, can be easily removed without compromising the optically favorable texture features.

It is noted that the terms "catalyze", "catalysis", "catalyst" and other similar words and phrases used throughout this disclosure refer and relate to the enabling or facilitating effect that certain metals have on random texturing of Si, when they are added to the RIE environment. It is not certain, at this time, whether a classic chemical catalysis is involved, wherein the plasma process is changed due to alteration of reaction pathways. Indeed, the precise chemical and/or physical mechanism(s) responsible for the formation of desirable surface texture features evidently mediated by the presence of metal in the chamber are not presently known, although studies aimed at a complete understanding of underlying physical mechanisms are underway. Rather, for purposes of this application, "catalysis" and other related language is intended to convey the fact that, although surface texturing of silicon can be accomplished using techniques other than those described herein, speed, control and quality of results are all significantly enhanced by introducing the metals in the fashion herein disclosed.

Accordingly, an advantage of the invention is that it provides a method forming a textured surface on a substrate by generating randomly distributed surface features thereon.

Another advantage of the invention is that it includes exposing a surface of such substrate to a reactive ion etching plasma comprising at least one etchant and particles of metal introduced into the plasma.

Another advantage of the invention is that the techniques of the invention result in nanoscale surface texture features having dimensions smaller than the wavelength of light in the solar spectrum (meaning, specifically, light that is capable of causing the photovoltaic effect in silicon solar cells).

Yet another advantage of the present invention is that metal catalysts can be introduced in to a reactive ion etching chamber in various ways including by placing discrete metal sources in the chamber in the presence of a substrate to be textured, and pre-conditioning the interior surfaces of a reactive ion etching chamber using, for example, a thin coating of metal.

Upon further study of the specification and appended claims, further objects and advantages of the invention will become apparent to those skilled in the art.

DETAILED DISCUSSION

The nano-texturing process of the present invention is based on the critical influence of the metal catalysts on the fundamental nature of the random RIE texturing in Si. This metal-assisted process helps achieve highly uniform textures over a wide process range. The present process, in one embodiment, utilizes non-toxic and inert etchants such as $SF_6$ and $O_2$ gases. This allows for safer and lower cost processing in comparison with hazardous etchants, such as $Cl_2$ gas employed by some researchers, for example, in Japan. Cost savings are associated with using less hazardous etchants. It is noted, however, texturing can be optimized using the metal catalyst process disclosed here when etchants other than $SF_6$ and $O_2$, including those based on chlorine, bromine and fluorine plasma chemistries, are used.

The invention process produces silicon (e.g., an mc-Si solar cell) with controllable randomly textured feature dimensions either smaller, or comparable to the solar spectrum wavelengths inside the semiconductor surface. Surfaces textured according to the invention appear black, or grey to the human eye, and scanning electron micrographs (SEMs) show that the textured profiles achieved are a critical function of the metal catalyst used.

According to one embodiment of the invention, surface texturing is achieved by placing metal-coated small pieces of silicon in the RIE chamber in proximity to a silicon wafer or other silicon substrate. (It is noted that mention of the silicon wafer is made here to illustrate one type of silicon substrate suited to texturing according to the principles of the invention. Other silicon surfaces, such as those of actual silicon solar cells or other bulk silicon material, can be textured, as well, according the processes described herein. Moreover, other semiconductor and dielectric materials, including glass, can be textured according to the principles described herein.) The presence of the metallic material in the RIE chamber, and specifically, in proximity to the surface to be etched, results in a distinctive texturing profile.

It is assumed that during the etching process, microscopic metallic particles are scattered into the RIE plasma. These metallic particles are believed to deposit on the silicon surface. It is thought that this process causes the formation of high-resolution, randomly-oriented micro-masks, which act to shield points on the Si surface, at least temporarily, from etching.

FIGS. 1(a)–(d) are schematic illustrations showing the influence of Cr in the chamber during RIE-texture processes on round, 4-inch Si wafers. The chamber used in generating these results was Plasma-Therm™ 790 reactor. In this system, a large parameter space matrix consisting of power, pressure, gas ratios, and etch times was investigated. Desirable texturing results were achieved for RF power of ~300 W, $SF_6$ flow rate ~14 sccm, $O_2$ flow rate ~16 sccm, chamber pressure ~170 mTorr, and etch time ~15 minutes.

Figure 1A:
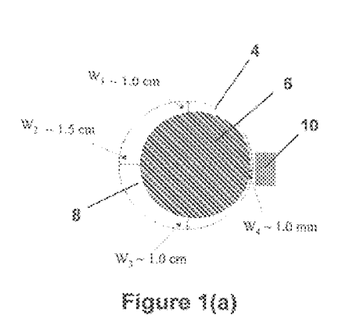
FIGS. 1(a)–1(d) are schematic illustrations of texturing resulting from various strategic placements of metal-coated silicon chips relative to silicon to be textured in an RIE chamber.

FIG. 1(a) shows the influence on RIE using $SF_6/O_2$ single source of Cr 10 (film thickness ~50 nm, on a piece of silicon having dimensions of ~2 cm ×1.5 cm) positioned nearly adjacent to (<<1 inch from) the boundary of a 4-inch diameter Si wafer 4. FIG. 1(a) shows that the Cr assisted RIE process described above results in an approximately oval textured region 6. The textured surface generally extended over a large proportion of the wafer and was particularly apparent in the region of the wafer closest to the Cr sample. In those regions of the wafer most distant from the metal sample, no significant amount of texturing occurred. FIG. 1(a) includes width desigations $W_1$, $W_2$, $W_3$, and $W_4$ to show representative widths (ranging from about 1 mm closest to the Cr source 10 to about 1.5 cm furthest from the Cr source 10) of portions of the non-textured region 8.

Figure 1B:
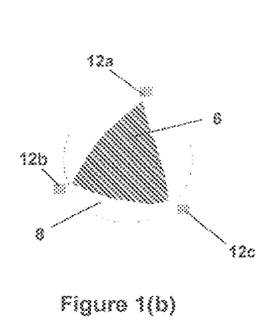
Figure 1C:
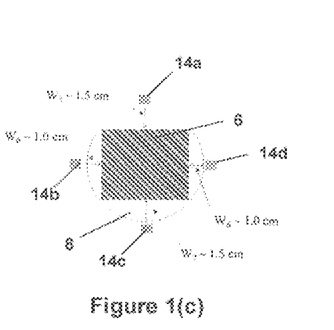
Figure 1D:
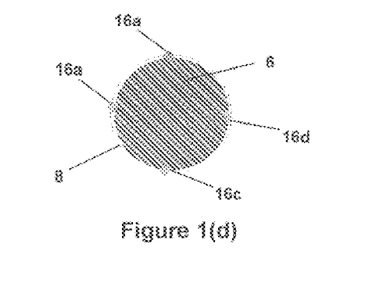

FIG. 1(b) shows results from a similar test in which three separate Cr sources 12a, 12b, 12c (film thickness ~50 nm, Si dimensions ~5 mm×5 mm) are approximately evenly spaced around the perimeter of a 4-inch diameter Si wafer 4. FIG. 1(b) shows an approximately triangular textured region 6 using Cr-assisted RIE with three samples. FIG. 1(c) shows a generally rectangular textured area 6 that resulted from using four Cr sources 12a–d (film thickness ~50 nm, Si dimensions ~5 mm×5 mm) approximately evenly spaced around the perimeter of a 4-inch diameter Si wafer. Widths $W_5$–$W_8$ (ranging between ~1.0 and ~1.5 cm) are given in the figure to show approximate size of the non-textured region 8 relative to the textured region 6. Finally, FIG. 1(d) shows a generally circularly symmetric pattern achieved by a symmetric placement of 4 Cr sources 16a–16d (film thickness ~50 nm, Si dimensions ~5 mm×5 mm) on the wafer itself. The non-textured region 8 is also shown in each of the FIGS. 1(b)–(d), just described. As compared to texturing illustrated in FIGS. 1(a)–(c), FIG. 1(d) also shows better uniformity of texturing across the wafer by placing sources on the water edge.

Figure 2A:
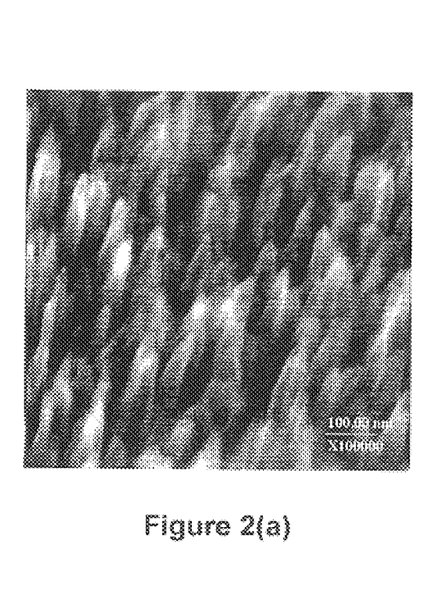
FIGS. 2(a)–2(b) show SEM pictures of a textured region created using Cr as the metallic catalyst.
Figure 2B:
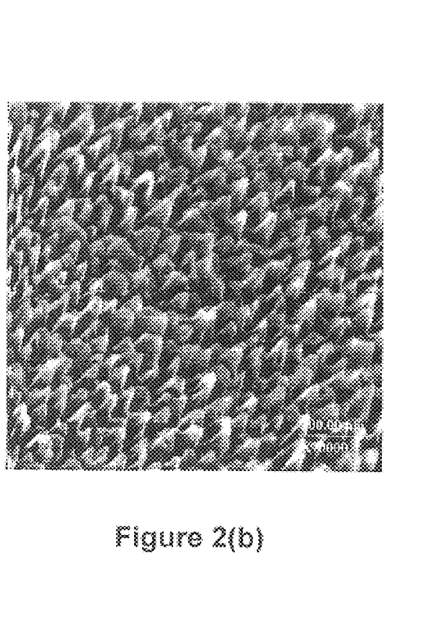

For each of the tests just mentioned, the introduction of very small Cr sources significantly reduces reflection and improves the uniformity of the textured region. FIGS. 2(a) and 2(b) show SEM pictures of a textured region created using Cr as the metallic catalyst. (FIG. 2(a) shows a magnification of ×100000, the horizontal bar represents a length of 100 nm; FIG. 2(b) shows a magnification of ×70000, the horizontal bar represents a length of 200 nm.) The columnar features shown in the figures, created using Cr-assisted RIE texturing process have diameters of ~20–50 nm, separation of ~50 nm, and depths of ~500 nm.

Figure 3A:
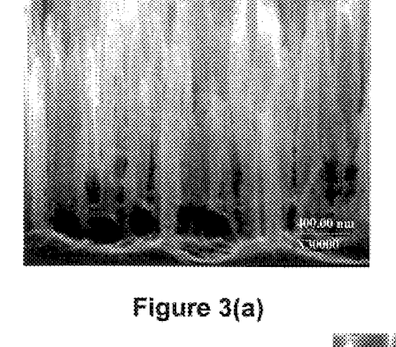
FIGS. 3(a)–3(c) show SEM pictures of RIE textures achieved using Al, Ti, and Pd, respectively, as catalysts.
Figure 3B:
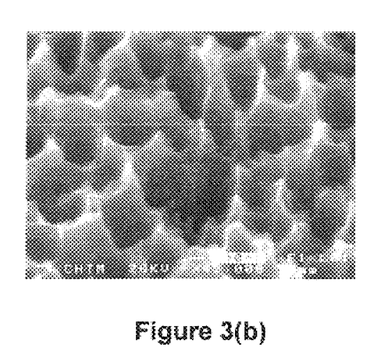
Figure 3C:
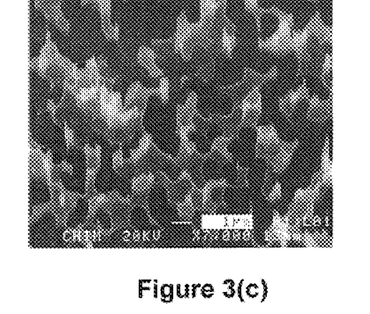

Texturing using various other metals have also been investigated. FIGS. 3(a)–(c) show some examples of RIE textures achieved using Al, Ti, and Pd, respectively, as catalysts. We notice that the texture profiles and dimensions are drastically influenced by introduction of various catalysts. For instance, Al-assisted texturing, illustrated in FIG. 3(a), gives rise to columnar profiles, Ti-assisted RIE (illustrated in FIG. 3(b)) gives rise to hole-like patterns, and Pd-assisted RIE (illustrated in FIG. 3(c)) results in much larger dimensions.

Figure 4:
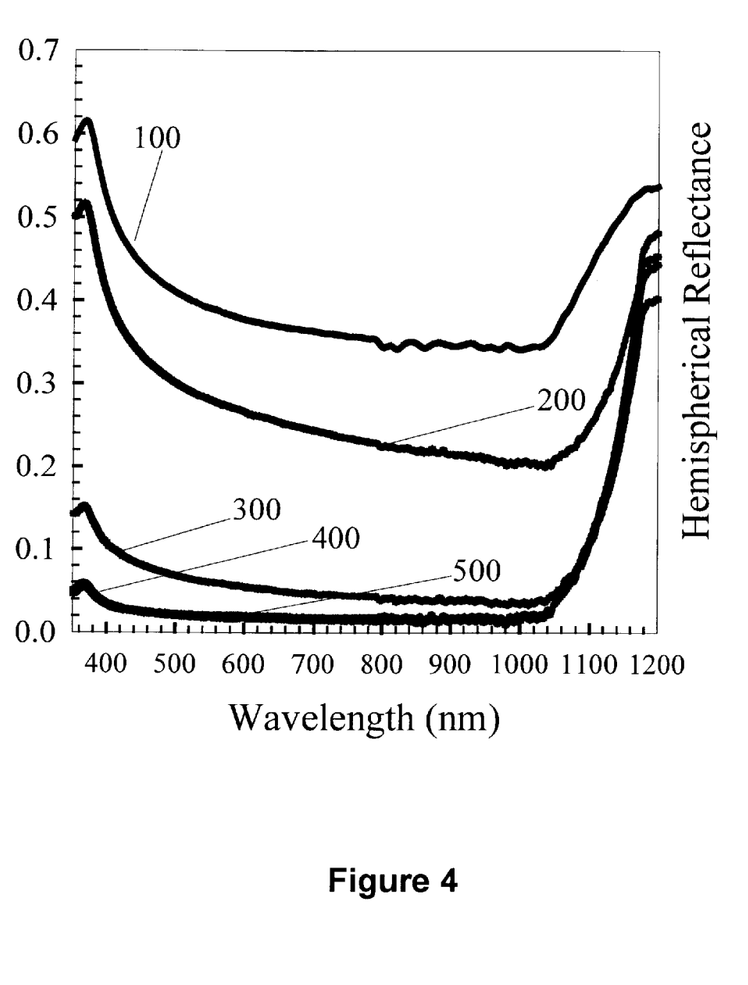
FIG. 4 is a graphical plot showing spectral hemispherical reflectance measurements from metal-assisted textured surfaces.

FIG. 4 shows spectral hemispherical reflectance measurements from metal-assisted textured surfaces. Plots are shown for Pd texturing (200), Al texturing (300), Ti texturing (400), and Cr texturing (500). For comparison, reflection from planar Si surface is also plotted (100). It is seen that both Cr and Ti assisted textures have similar reflectance response despite significant variation in their textured profiles. The larger Pd-assisted textures exhibit much higher reflection even though it is still less than that of a planar surface. The Al-assisted texture reflection lies in between Pd and Cr-assisted textures.

Figure 5:
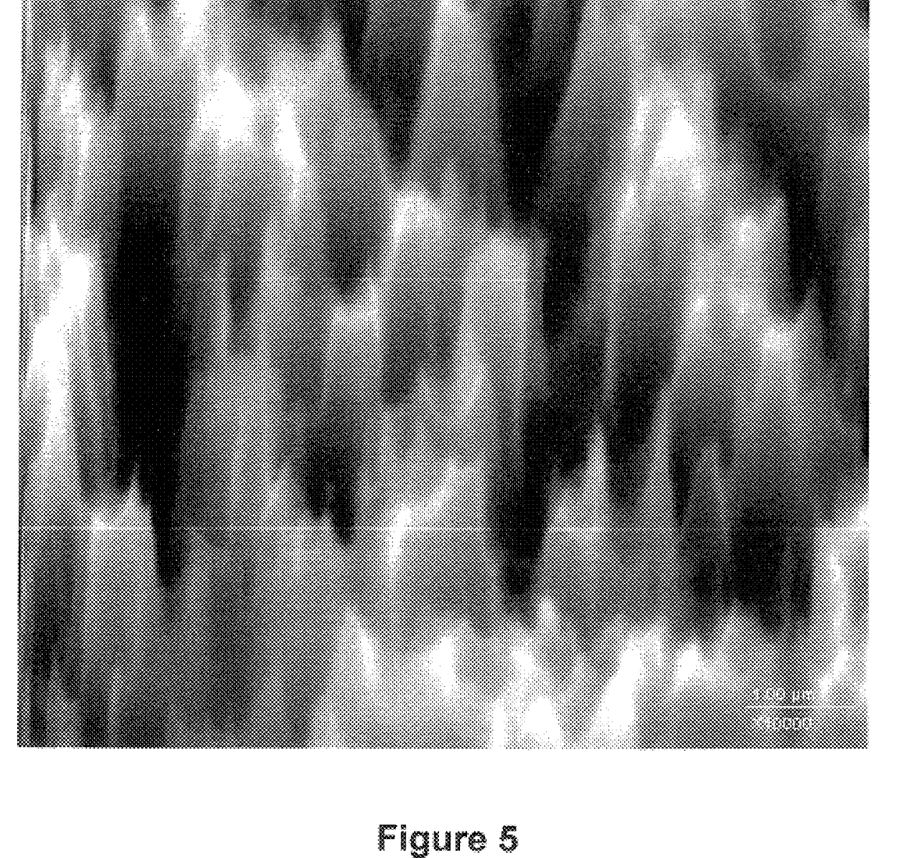
FIG. 5 shows an SEM picture of a textured region created using an Al metal catalyst.
Figure 6:
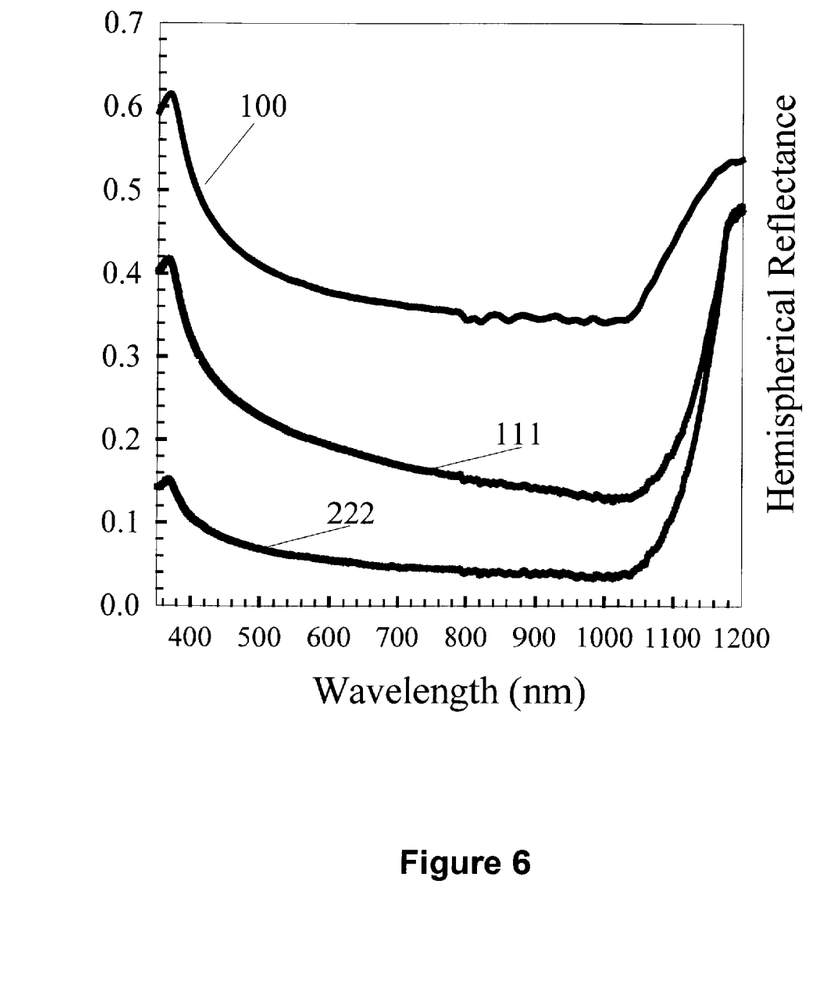
FIG. 6 is a graphical plot showing hemispherical reflectance measurements comparing different Al-assisted texturing methodologies.

We have also investigated placement of metal catalysts relative to the wafer and its influence on the texture profile. FIG. 5 shows an example of texture obtained for Al samples placed ~3–4 inches away from the wafer. Notice that in comparison with the columnar profile shown in FIG. 3(a), relatively larger features are obtained (on the order of 200–500 nm in width, with a separation distance of about 500 nm. These features exhibit longitudinal dimensions of about 500–1000 nm, and larger. FIG. 6 shows reflectance measurements from two Al-assisted RIE processes. Also in this Figure, for comparison, reflection from planar Si surface is also plotted (100). The plot designated 111 shows hemispherical reflection measurements for Al-assisted random RIE-textured surfaces with the Al source near the wafer. The plot designated 222 shows data for the circumstance in which the Al source is further away from the wafer. It is seen that for Al samples further away from the wafer, significantly lower reflection is achieved. This process also improves texture uniformity and extension over larger wafer regions.

Figure 7:
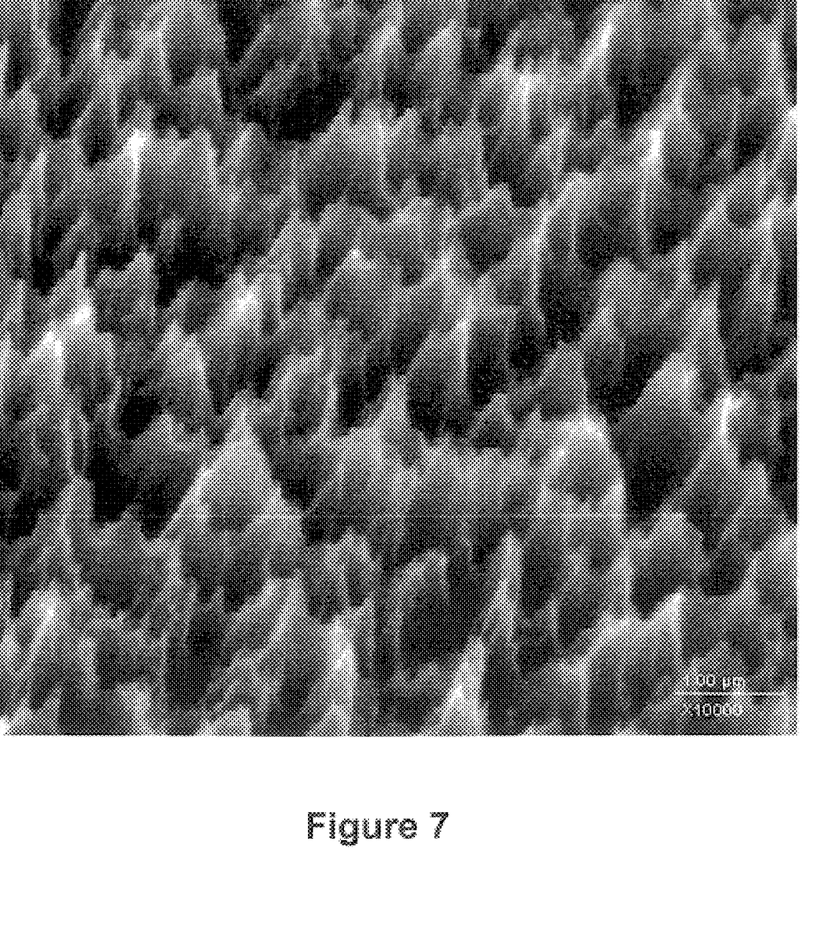
FIG. 7 shows an SEM picture of a textured region created using a process involving conditioning of a RIE chamber with a thin layer coating of metal.
Figure 8:
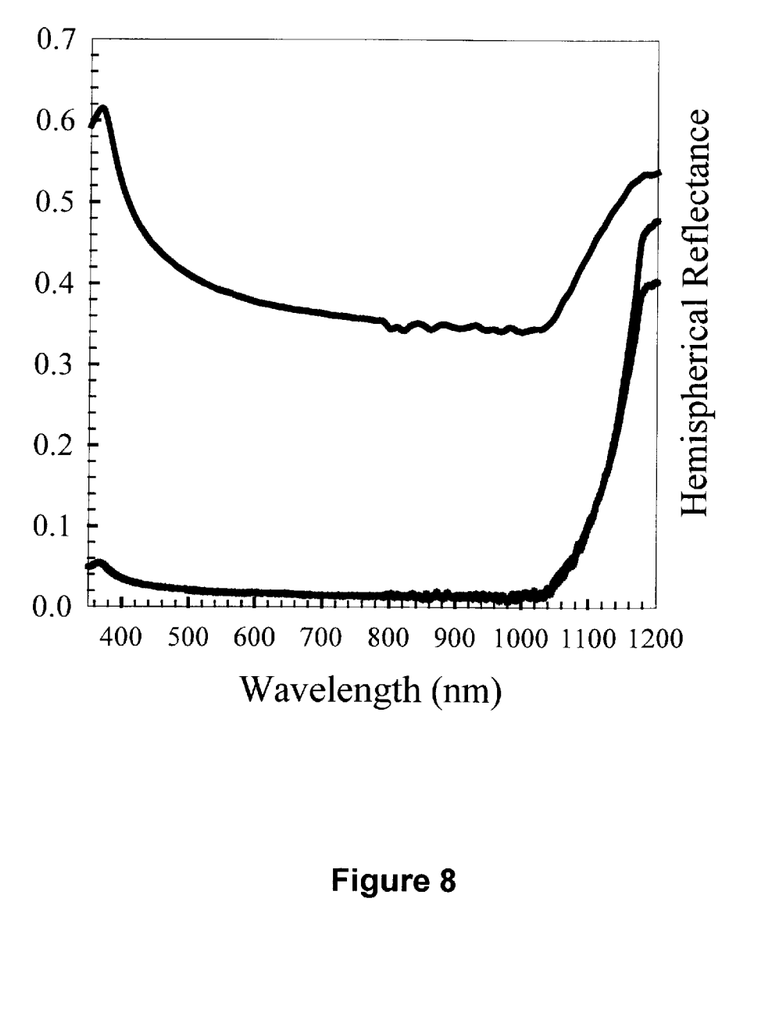
FIGS. 8–10 are graphical plots showing hemispherical reflectance measurements relating to silicon textured using the chamber conditioning technique of the invention.

According to an alternative embodiment, instead of placing metal sources at strategic locations around the wafer, studies have been performed that involve conditioning the interior surfaces of RIE chamber to supply the metal catalysts during the RIE-texturing process. Early studies led to the discovery that metal has a catalytic effect on Si texturing discovered that Al particles sputtered off the reaction chamber walls during RIE probably deposited on the wafer resulting in randomly textured surfaces. J. I. Giftleman, E. K. Sichel, H. W. Lehman, and R. Widmer, "Textured silicon: a selective absorber for solar thermal conversion," Appl. Phys. Lett. 35, pp. 742–744, 1979. Therefore, the inventors undertook to deliberately coat the reaction chamber walls with various metals to determine of the desired texture result could be engineered in this way. Success has been achieved using this chamber-conditioning approach. In a typical example of this embodiment, an Al-assisted RIE-texturing process is carried out for ~15-minutes using process parameters described earlier. This is followed by an identical Cr-assisted texturing process. These two RIE processes presumably result in mono-layers coating the inner walls of the RIE chamber surface. A number (typically ~4–5) of Si wafers are subsequently textured using identical RIE parameters except for the metal catalysts. FIG. 7 shows SEM pictures of the conditioned texture. These features are typically triangular and are approximately an order of magnitude larger than Cr-assisted features. FIG. 8 shows reflectance measurements from these surfaces. The plot designated 333 shows results obtained from texturing using the chamber conditioning technique where a thin (presumably monolayer) coating of Al is deposited on the interior surfaces of the RIE chamber followed by a thin coating of Cr prior to etching of the Si. For comparison, we have plotted Cr-assisted reflectance (plot 500) obtained using the previously described embodiment using strategic placement of metal sources relative to the Si wafer. (This is the same plot 500 shown in FIG. 4.) It is seen that surfaces textured using the two different techniques (conditioning, and discrete metal source) exhibit similar reflectance response. Again, also for comparison, reflection from planar Si surface is also plotted (100).

Figure 9:
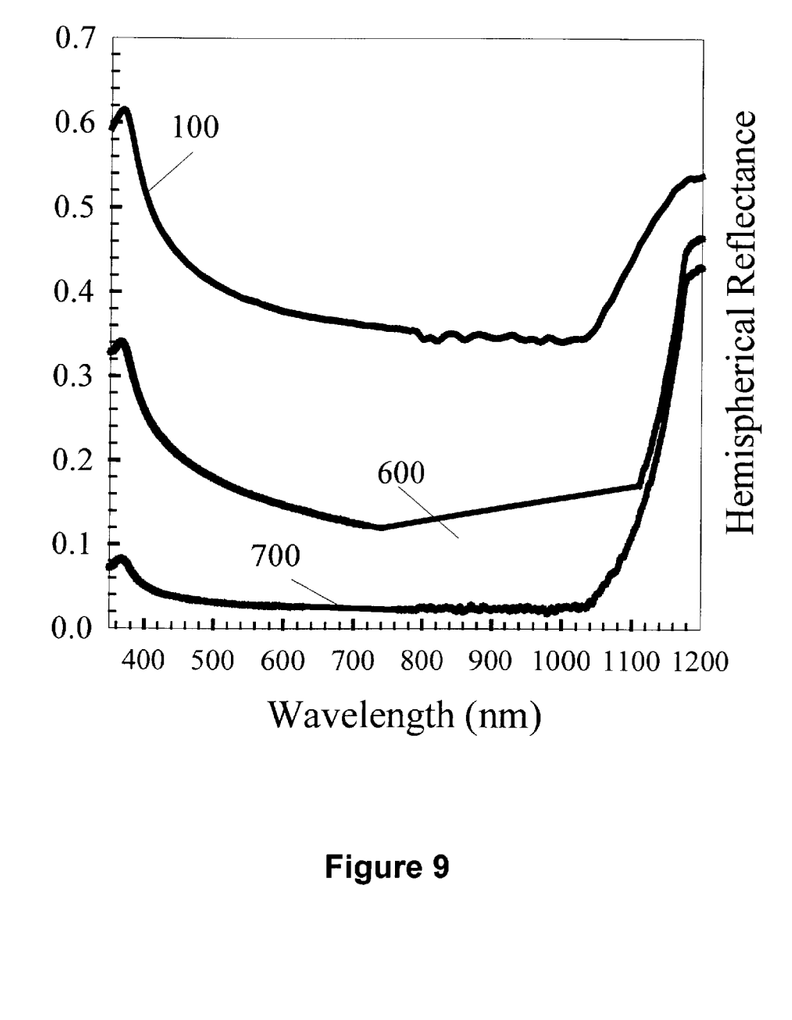

We have also investigated texture variation with respect to cathode. FIG. 9 shows reflectance measurements from textured surfaces using graphite and Si cathodes. The figure shows hemispherical reflection measurements from planar (100), and random RIE-textured surfaces on graphite (600) and Si (700) cathodes. It is seen that significantly lower reflectance is achieved using a Si cathode.

Figure 10:
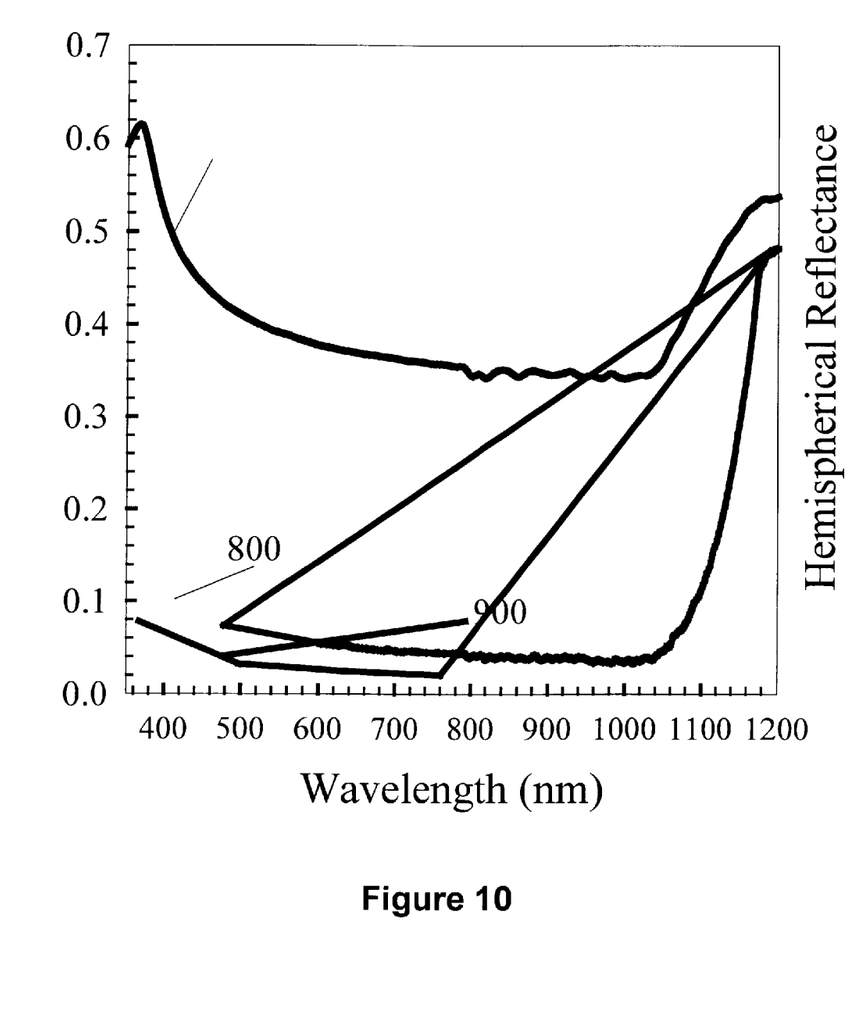

And, finally, we investigated texture variation with cathode temperature. FIG. 10 shows reflectance measurements from two conditioned texture processes carried out at ~20° C. (plot 800) and ~1° C. (plot 900) temperatures. It is seen that lower temperature process gives rise to a significantly lower reflectance.

Highly uniform texturing can be achieved by conditioning of the RIE chamber, and furthermore, this approach has the potential for being highly economical. For example, by conditioning a reaction chamber with metal coating, high throughput can be achieved since many etching runs can be completed without need for adding more metal. Eventually, the metal coating inside the chamber will degenerate, however, the potential exists for large amounts of Si to be textured in between down periods when reconditioning is done.

Earlier in this disclosure, mention was made regarding surface damage as a result of the RIE processes. In some etching processes, a slight damage to the Si surface occurs. As a consequence of such damage, carrier recombination results in reduced photo-current from Si solar cells, requiring post RIE follow-up treatments aimed at removing the damaged material. The techniques described here, however, do not cause a large degree of surface damage, and damage-removal etches may be unnecessary. Optionally, if slight damage does result from the $SF_6/O_2$ etch, and removal of the damaged layer is desired, this can be accomplished by using dilute wet etches. For example, about 4–5 minutes of etching of the textured Si surface in 40% by weight of potassium hydroxide, or about 10 seconds in a mixture of nitric acid and hydrofluoric acid (~10:1), will remove damage without compromising the surface texture features. Other etchants for this purpose could include mixtures of hydrofluoric acid, nitric acid and acetic acid. Also, alternatively, damage may be removed by performing an isotropic plasma-less Si etch, i.e., using the vapor pressure from a $XeF_2$ crystal source, after the randomly distributed surface features have been generated.

Figure 11:
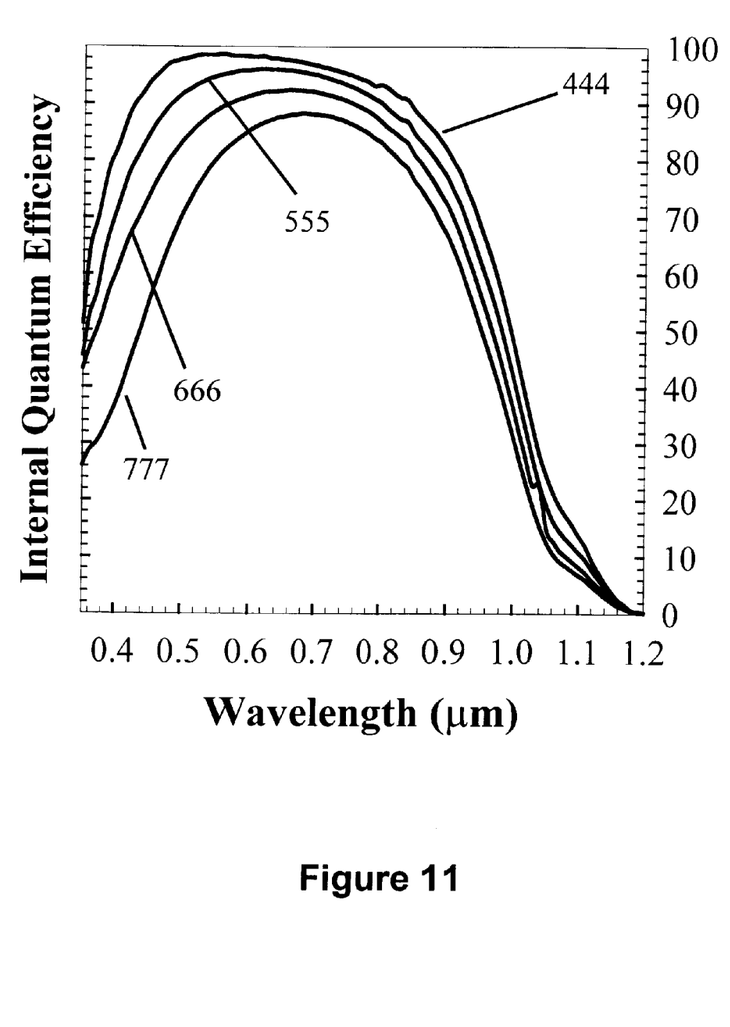
FIG. 11 shows a comparison of internal quantum efficiency measurements relating to various treatments applied to remove damage associated with RIE etch.

FIG. 11 shows a comparison of internal quantum efficiency measurements relating to various treatments applied to remove damage. The Figure shows measurements for planar silicon (plot 444), untreated random RIE-textured silicon (plot 777) and KOH-etched treated RIE-textured Si solar cells (plot 666 showing results obtained using a 60-second treatment, and plot 555 showing results obtained using a 270-second treatment). It is apparent from these data that quantum efficiency improves by removal of surface damage using KOH. Removal of surface damage, however, is considered an optional step for purposes of the present invention, and it is noted that favorable results can be obtained even when the damage-removal etch is not performed.

From the foregoing description, one skilled in the art can easily ascertain the essential characteristics of the invention defined in this specification and the appended claims, and without departing from the spirit and scope thereof, can make various changes and modifications of the invention to adapt it to various usages and conditions. Such changes and modifications as would be obvious to one skilled in the art are intended to be included within the scope of the following claims. The entire disclosures of all references, applications, patents and publications cited above are hereby incorporated by reference.

We claim:

1. A method forming a textured surface on a substrate by generating randomly distributed surface features thereon, comprising the step of:
   exposing a surface of such substrate to a reactive ion etching plasma comprising at least one etchant and particles of metal introduced into the plasma from at least one source.

2. The method of claim 1 wherein said substrate is selected from the group consisting of semiconductor materials, dielectric materials and glass.

3. The method of claim 1 wherein the substrate comprises silicon.

4. The method of claim 3 wherein said exposing of said surface to a reactive ion etching plasma takes place in a chamber comprising at least one internal wall, and the at least one source of metal is selected from the group consisting of:
   at least one discrete source of metal positioned within said chamber, and
   a coating of metal adhering to the at least one internal wall of said chamber.

5. The method of claim 4 wherein said metal is selected from the group consisting of Cr, Au, Cu, Al, Pd, and Ti and any combination thereof.

6. The method of claim 5 wherein the echant comprises at least one constituent selected from the group consisting of Cl, Br, F, $SF_6$ and $O_2$, and any combination thereof.

7. The method of claim 6 wherein said at least one discrete source of metal comprises at least one metal-coated silicon sample placed within said chamber in a position selected from the group consisting of
   a position in which the at least one metal-coated silicon sample touches a surface to be textured, and
   a position in which the at least one metal-coated silicon sample lies adjacent to a surface to be textured, but does not touch said surface to be textured.

8. The method of claim 7 further comprising the step of performing an etch after the randomly distributed surface features have been generated, said etch being performed using an etchant selected from the group consisting of
   KOH,
   a mixture of nitric acid and hydrofluoric acid,
   a mixture of nitric acid, hydrofluoric acid and acetic acid, and
   xenon fluoride vapor.

9. A method for creating a textured surface on silicon for use in a solar cell comprising the steps of
   placing a silicon wafer which includes a surface inside a reactive ion etching chamber
   introducing a metal source into the reactive ion etching chamber
   performing reactive ion etching of the surface of the silicon wafer within the chamber whereby
      a plasma cloud is formed within the chamber, and
      due to the presence of the metal source inside the reactive ion etching chamber, metal particles from said metal source become suspended at least temporarily in said plasma cloud.

10. The method of claim 9 wherein at least some of the metal particles deposit on the surface of the silicon wafer forming a plurality of micro-masks that shield at least a portion of the silicon and render that portion of silicon shielded by the micro-masks at least temporarily impervious to etching.

11. The method of claim 10 wherein the reactive ion etch is perfomed using RF power of about 300 W, etch time is about 15 minutes, etchant gases used include $SF_6$ at a flow rate of about 14 sccm and $O_2$ at a flow rate of about 16 sccm, and chamber pressure is about 170 mTorr.

12. A silicon solar cell comprising a metal catalyst-mediated textured surface formed by a process comprising the steps of:
   placing material comprising silicon, which material includes a surface, inside a reactive ion etching chamber
   introducing a metal source into the reactive ion etching chamber
   performing reactive ion etching of the material within the chamber whereby
      a plasma cloud is formed within the chamber, and
      due to the presence of the metal source inside the reactive ion etching chamber, metal particles from said metal source become suspended at least temporarily in said plasma cloud.

13. The silicon solar cell of claim 12 wherein the metal particles deposit on the surface of the silicon wafer forming a plurality of micro-masks that shield at least a portion of the silicon and render that portion of silicon shielded by the micro-masks at least temporarily impervious to etching, thereby causing formation of surface texture comprising randomly distributed surface features.

14. The silicon solar cell of claim 13 wherein the randomly distributed surface features comprise structures at least some of which are selected from the group consisting of generally columnar structures having certain dimensions smaller than the wavelength of light in the solar spectrum, and generally pyramidal structures having certain dimensions are smaller than the wavelength of light in the solar spectrum.

15. The silicon solar cell of claim 14 wherein the surface features comprise structures having diameters of about 20 nm to about 50 nm.

16. The silicon solar cell of claim 15 wherein the surface features comprise structures that are separated by about 50 nm and exhibit longitudinal dimensions of about 500 nm.

17. The silicon solar cell of claim 14 wherein the surface features comprise structures having diameters of about 200 nm to about 500 nm, and larger.

18. The silicon solar cell of claim 14 wherein the surface features comprise structures that are separated by about 500 nm and exhibit longitudinal dimensions of about 500–1000 nm, and larger.

\* \* \* \* \*